United States Patent
Vethake et al.

(10) Patent No.: US 11,876,343 B2
(45) Date of Patent: Jan. 16, 2024

(54) LASER DIODE PACKAGING PLATFORMS

(71) Applicant: Trumpf Photonics, Inc., Cranbury, NJ (US)

(72) Inventors: Thilo Vethake, West Windsor, NJ (US); Stefan Heinemann, Hightstown, NJ (US); Le Zhao, Bethlehem, PA (US)

(73) Assignee: Trumpf Photonics, Inc., Cranbury, NJ (US)

( * ) Notice: Subject to any disclaimer, the term of this patent is extended or adjusted under 35 U.S.C. 154(b) by 299 days.

(21) Appl. No.: 17/323,329

(22) Filed: May 18, 2021

(65) Prior Publication Data

US 2022/0376478 A1    Nov. 24, 2022

(51) Int. Cl.
*H01S 5/00* (2006.01)
*H01S 5/02365* (2021.01)
(Continued)

(52) U.S. Cl.
CPC .......... *H01S 5/02365* (2021.01); *H01S 5/023* (2021.01); *H01S 5/0239* (2021.01);
(Continued)

(58) Field of Classification Search
CPC .. H01S 5/02365; H01S 5/023; H01S 5/02315; H01S 5/0239; H01S 5/02469; H01S 5/4012; H01S 5/4018; H01S 5/4025; H01S 5/4031; H01S 5/02345; H01S 5/0237; H01S 5/042; H01S 5/02251
See application file for complete search history.

(56) References Cited

U.S. PATENT DOCUMENTS

| 4,338,577 A | 7/1982 | Sato et al. |
| 4,393,393 A | 7/1983 | Allen et al. |

(Continued)

FOREIGN PATENT DOCUMENTS

| DE | 10229712 | 1/2004 |
| DE | 102018210142 | 12/2019 |

(Continued)

OTHER PUBLICATIONS

U.S. Non-Final Office Action in United States U.S. Appl. No. 17/323,328, dated Aug. 31, 2022, 23 pages.

*Primary Examiner* — Kinam Park
(74) *Attorney, Agent, or Firm* — Fish & Richardson P.C.

(57) ABSTRACT

Methods, devices, and systems for laser diode packaging platforms are provided. In one aspect, a laser diode assembly includes a heat sink and a plurality of laser diode units horizontally spaced apart from one another on the heat sink. Each laser diode unit includes: a first submount positioned on the heat sink and spaced apart from adjacent another first submount, a laser diode including an active layer between a first-type doped semiconductor layer and a second-type doped semiconductor layer, a bottom side of the laser diode being positioned on the first submount, and a second submount positioned on a top side of the laser diode and spaced apart from adjacent another second submount. The first submount, the laser diode, and the second submount in the laser diode unit are vertically positioned on the heat sink. The laser diodes of the plurality of laser diode units are electrically connected in series.

17 Claims, 8 Drawing Sheets

(51) Int. Cl.
    *H01S 5/40* (2006.01)
    *H01S 5/024* (2006.01)
    *H01S 5/023* (2021.01)
    *H01S 5/0239* (2021.01)
    *H01S 5/02315* (2021.01)
    *H01S 5/042* (2006.01)
    *H01S 5/0237* (2021.01)
    *H01S 5/02345* (2021.01)

(52) U.S. Cl.
    CPC ...... *H01S 5/02315* (2021.01); *H01S 5/02469* (2013.01); *H01S 5/4012* (2013.01); *H01S 5/4018* (2013.01); *H01S 5/4025* (2013.01); *H01S 5/4031* (2013.01); *H01S 5/0237* (2021.01); *H01S 5/02345* (2021.01); *H01S 5/042* (2013.01)

(56) References Cited

U.S. PATENT DOCUMENTS

| | | | |
|---|---|---|---|
| 5,105,430 A | 4/1992 | Mundinger et al. | |
| 5,337,328 A | 8/1994 | Lang et al. | |
| 5,606,181 A | 2/1997 | Sakuma et al. | |
| 5,835,515 A | 11/1998 | Huang | |
| 5,887,012 A | 3/1999 | Yamada | |
| 5,985,684 A | 11/1999 | Marshall et al. | |
| 6,211,511 B1 | 4/2001 | Shih et al. | |
| 6,240,116 B1 * | 5/2001 | Lang | G02B 27/0977 372/50.23 |
| 6,348,358 B1 | 2/2002 | Sousa et al. | |
| 6,423,561 B1 | 7/2002 | Chino et al. | |
| 6,829,278 B1 | 12/2004 | Allenson et al. | |
| 7,060,515 B2 | 6/2006 | Stephens et al. | |
| 7,092,420 B2 | 8/2006 | Kwak et al. | |
| 7,154,926 B2 | 12/2006 | Kouta et al. | |
| 7,664,153 B2 | 2/2010 | Inenaga et al. | |
| 7,944,956 B2 | 5/2011 | Miyajima et al. | |
| 8,000,360 B2 | 8/2011 | Faybishenko | |
| 8,213,479 B2 | 7/2012 | Doerfel et al. | |
| 8,611,389 B2 | 12/2013 | Shiraishi et al. | |
| 8,804,781 B2 | 8/2014 | Schleuning et al. | |
| 9,001,856 B1 | 4/2015 | Govorkov et al. | |
| 9,450,377 B1 | 9/2016 | Roff et al. | |
| 9,559,491 B2 | 1/2017 | Horn et al. | |
| 10,297,980 B2 | 5/2019 | Ryu et al. | |
| 10,630,041 B2 | 4/2020 | Hemenway et al. | |
| 11,002,926 B1 | 5/2021 | Mathai et al. | |
| 11,018,472 B2 | 5/2021 | Nozaki | |
| 11,025,032 B2 | 6/2021 | Vethake et al. | |
| 11,557,874 B2 * | 1/2023 | Modak | H01S 5/4012 |
| 2004/0115911 A1 | 6/2004 | Hazlett et al. | |
| 2005/0270652 A1 * | 12/2005 | Voss | G02B 27/0972 359/618 |
| 2006/0109883 A1 | 5/2006 | Lewis et al. | |
| 2008/0019010 A1 | 1/2008 | Govorkov et al. | |
| 2008/0089371 A1 | 4/2008 | Reichart | |
| 2010/0260227 A1 | 10/2010 | Bessho et al. | |
| 2011/0069731 A1 | 3/2011 | Gokay | |
| 2012/0252144 A1 | 10/2012 | Schroeder et al. | |
| 2013/0058367 A1 | 3/2013 | Grove | |
| 2013/0243019 A1 | 9/2013 | Wakabayashi et al. | |
| 2014/0119393 A1 | 5/2014 | Schleuning et al. | |
| 2015/0055667 A1 | 2/2015 | Horn et al. | |
| 2017/0093125 A1 | 3/2017 | Demir et al. | |
| 2017/0244221 A1 | 8/2017 | Paoletti et al. | |
| 2018/0062346 A1 | 3/2018 | Horn et al. | |
| 2018/0138664 A1 | 5/2018 | Huelsewede et al. | |
| 2018/0269650 A1 | 9/2018 | Nozaki | |
| 2019/0280459 A1 | 9/2019 | Ishige et al. | |
| 2020/0185877 A1 | 6/2020 | Kawaguchi et al. | |
| 2020/0395738 A1 | 12/2020 | Von Freyhold et al. | |
| 2021/0057878 A1 | 2/2021 | Oomori | |
| 2021/0066891 A1 | 3/2021 | Katagiri et al. | |
| 2021/0119412 A1 | 4/2021 | Strohmaier et al. | |
| 2021/0119413 A1 | 4/2021 | Strohmaier et al. | |
| 2021/0126426 A1 * | 4/2021 | Tillkorn | H01S 5/4018 |
| 2022/0263293 A1 | 8/2022 | Ali et al. | |
| 2022/0376467 A1 | 11/2022 | Modak et al. | |

FOREIGN PATENT DOCUMENTS

| | | |
|---|---|---|
| EP | 2485346 | 8/2012 |
| EP | 3736924 | 11/2020 |
| GB | 2417366 A | 2/2006 |
| JP | 3154181 B2 | 4/2001 |
| WO | WO 2000/63967 | 10/2000 |
| WO | WO 2009/049799 | 4/2009 |
| WO | WO 2019/243325 | 12/2019 |
| WO | WO 2020/212221 | 10/2020 |

\* cited by examiner

LASER DIODE PACKAGING PLATFORMS

TECHNICAL FIELD

The present disclosure relates to laser diode packaging platforms.

BACKGROUND

High-powered semiconductor laser diodes are cooled to keep the junction temperature and carrier leakage low and reliability high. A laser diode can be mounted to a heat sink, which helps reduce thermal impedance. Integrating multiple laser diodes on a platform is desirable to achieve a higher power. However, it causes higher requirements for cooling and packaging.

SUMMARY

One aspect of the present disclosure features a laser diode assembly including: a heat sink extending along a horizontal direction and a plurality of laser diode units spaced apart from one another along the horizontal direction on the heat sink. Each laser diode unit includes: a first submount positioned on the heat sink and spaced apart from adjacent another first submount, a laser diode including an active layer between a first-type doped semiconductor layer and a second-type doped semiconductor layer, a bottom side of the laser diode being positioned on the first submount, and a second submount positioned on a top side of the laser diode and spaced apart from adjacent another second submount. The first submount, the laser diode, and the second submount in the laser diode unit are sequentially positioned on the heat sink along a vertical direction perpendicular to the horizontal direction. The laser diodes of the plurality of laser diode units are electrically connected in series.

In some implementations, the laser diode assembly further includes: a plurality of electrical contact pads spaced apart from one another along the horizontal direction on the heat sink, the first submount of each laser diode unit being positioned on a different corresponding electrical contact pad of the plurality of electrical contact pads. For each laser diode unit of the plurality of laser diode units, the first submount can be in electrical contact with the first-type doped semiconductor layer of the laser diode, and the second submount can be in electrical contact with the second-type doped semiconductor layer of the laser diode.

In some implementations, the laser diode assembly further includes: an electrical contact bar providing a serial electrical connection between a first laser diode of a first laser diode unit and a second laser diode of a second laser diode unit adjacent to the first laser diode unit. The electrical contact bar provides a direct electrical connection between the second submount of the first laser diode unit and a corresponding electrical contact pad on which the first submount of the second laser diode unit is positioned.

In some implementations, the heat sink includes a first heat sink, and the plurality of electrical contact pads includes a plurality of first electrical contact pads on the first heat sink. The laser diode assembly further includes a second heat sink positioned on the second submounts of the plurality of laser diode units, and each first submount and each second submount includes an electrically conductive material.

In some implementations, the laser diode assembly further includes: a plurality of second electrical contact pads spaced apart from each other on the second heat sink, each second electrical contact pad being in electrical contact with a different corresponding second submount of the second submounts of the plurality of laser diode units. The laser diode assembly can also include a plurality of vertical electrical contacts positioned between the first heat sink and the second heat sink, each vertical electrical contact providing a direct electrical connection between a corresponding first electrical contact pad and a corresponding second electrical contact pad. At least one first electrical contact pad provides a direct electrical connection between a corresponding vertical electrical contact and a corresponding first submount, and at least one second electrical contact pad provides a direct electrical connection between a corresponding vertical electrical contact and a corresponding second submount. Laser diodes of adjacent laser diode units can be electrically connected in series by a corresponding second electrical contact pad, a corresponding vertical electrical contact, and a corresponding first electrical contact pad.

The first heat sink can include top and bottom sides along the vertical direction. The plurality of laser diode units include a plurality of first laser diodes units that are positioned on the top side of the first heat sink. The laser diode assembly can further include a third heat sink extending along the horizontal direction and a plurality of second laser diode units spaced apart from each other along the horizontal direction on the third heat sink. A bottom side of each second laser diode unit can be positioned on the third heat sink. Second laser diodes of the plurality of second laser diode units can be electrically connected in series. The bottom side of the first heat sink can be positioned on top sides of the plurality of second laser diode units.

In some implementations, the laser diode assembly further includes: a plurality of third electrical contact pads spaced apart from one another on the bottom side of the first heat sink. Each third electrical contact pad is in electrical contact with the top side of a different corresponding second laser diode unit. At least one third electrical contact pad provides a serial electrical connection between the second laser diodes of adjacent second laser diode units. In some examples, a particular third electrical contact pad is in electrical connection with a particular first electrical contact pad, such that the second laser diodes of the plurality of second laser diode units are electrically connected in series with the first laser diodes of the plurality of first laser diodes units.

The first heat sink can include a first edge extending along the horizontal direction, the second heat sink can include a second edge extending along the horizontal direction, and the third heat sink can include a third edge extending along the horizontal direction. Each first laser diode of the plurality of first laser diode units can be configured to emit a first light beam from a first facet of the first laser diode, the first facets of the first laser diodes being aligned with and adjacent to the first edge and the second edge. Each second laser diode of the plurality of second laser diode units can be configured to emit a second light beam from a second facet of the second laser diode, the second facets of the second laser diode being aligned with and adjacent to the first edge and the third edge.

In some implementations, the laser diode assembly further includes a corresponding micro-optical system configured to optically combine the first light beam emitted from each first laser diode of the plurality of first laser diode units and the second light beam emitted from a corresponding second laser diode positioned under the first laser diode.

In some implementations, the micro-optical system includes: a first fast-axis collimating (FAC) lens for collimating the first light beam along a fast axis of the first light beam, a second FAC lens for collimating the second light beam along a fast axis of the second light beam that is substantially parallel to the fast axis of the first light beam, an optical beam combiner arranged downstream the first FAC lens and configured to transmit the first light beam collimated by the first FAC lens, and a redirecting mirror arranged downstream the second FAC lens and configured to reflect the second light beam collimated by the second FAC lens to the optical beam combiner.

The optical beam combiner is configured to reflect the second light beam from the redirecting mirror towards a direction along the first light beam. In some examples, the optical beam combiner is configured to optically multiplex the first light beam and the second light beam by polarization multiplexing. In some examples, the optical beam combiner is configured to optically stack the first light beam and the second light beam.

In some implementations, each laser diode unit of the plurality of laser diode units includes a different corresponding laser diode bar having multiple emitters spaced apart from one another along the horizontal direction, each emitter of the multiple emitters being configured to emit a light sub-beam. The laser diode assembly can further include a plurality of micro-optical systems arranged downstream the laser diode bars of the plurality of laser diode units, each micro-optical system being configured to couple the light sub-beams from the multiple emitters of a different corresponding laser diode bar into a corresponding optical fiber. Each micro-optical system of the plurality of micro-optical systems can include: a beam transformation system arranged downstream the different corresponding laser diode bar and configured to shape the light sub-beams from the multiple emitters, and a focus lens arranged downstream the beam transformation system and configured to focus the shaped light sub-beams into the corresponding optical fiber.

Another aspect of the present disclosure features a laser diode assembly including: a heat sink having an edge extending along a horizontal direction, a plurality of electrical contact pads spaced apart from one another along the horizontal direction on the heat sink, a plurality of submounts spaced apart from one another along the horizontal direction on the heat sink, each submount of the plurality of submounts being positioned on a different corresponding electrical contact pad of the plurality of electrical contact pads, and a plurality of laser diodes. Each laser diode includes a corresponding active layer between a first-type doped semiconductor layer and a second-type doped semiconductor layer and being configured to emit a light beam from a facet of the laser diode. A bottom side of each laser diode is positioned on a different corresponding submount of the plurality of submounts. The facets of the plurality of laser diodes are aligned with and adjacent to the edge of the heat sink. The plurality of laser diodes are electrically connected in series.

In some implementations, the laser diode assembly further includes: at least one electrical contact bar providing a serial electrical connection between first and second adjacent laser diodes, and at least one electrical contact wire providing an electrical connection between a top side of the first laser diode to the at least one electrical contact bar. The at least one electrical contact bar is in electrical contact with a corresponding electrical contact pad on which a corresponding submount for the second laser diode is positioned.

A corresponding submount and a corresponding laser diode can be sequentially positioned on each electrical pad of the plurality of electrical pads along a vertical direction perpendicular to the horizontal direction. The plurality of laser diodes can be configured to emit the light beams from the facets of the plurality of laser diodes along a third direction perpendicular to a plane defined by the horizontal direction and the vertical direction, fast axes of the light beams being collinear along the vertical direction, slow axes of the light beams being collinear along the horizontal direction.

In some implementations, the laser diode assembly includes: for each laser diode of the plurality of laser diodes, a fast-axis collimating (FAC) lens configured to collimate the light beam along the fast axis of the light beam and a reflecting mirror arranged downstream the FAC lens and configured to reflect the light beam to an optical combiner. The optical combiner is configured to optically stack the light beams along the vertical direction.

In some implementations, the laser diode assembly further includes: a plurality of beam twisters for the plurality of laser diodes, each beam twister being configured to rotate the light beam emitted from a different corresponding laser diode by 90 degrees. The laser diode assembly further includes: a plurality of optical fibers arranged downstream the plurality of beam twisters, each optical fiber being configured to receive the light beam rotated by a different corresponding beam twister.

In some implementations, the plurality of laser diodes forms a plurality of laser diode bars. The laser diode assembly includes a plurality of beam twisters for the plurality of laser diode bars, each beam twister being configured to rotate light beams emitted from individual emitters in a different corresponding laser diode bar by 90 degrees such that light beams from the individual emitters are optically stacked along the horizontal direction.

The details of one or more embodiments of the invention are set forth in the accompanying drawings and the description below. Other features, objects, and advantages of the invention will be apparent from the description and drawings, and from the claims.

DETAILED DESCRIPTION

The output power of laser diodes (or diode lasers) is limited in large part by heat dissipation, which causes the temperature of the laser diodes to increase, which, in turn, can reduce the reliability and operating efficiency of the laser diodes. Heat sinks (or heatsinks) with high thermal conductivity, such as copper coolers, can be used to keep the laser diode temperature stable during operation. In some cases, cooling on both sides (i.e., double-sided cooling) of a laser diode, rather than cooling on a single side (i.e., single-sided cooling), can improve the stability and operating efficiency of the laser diode even further. However, making electrical contact to a laser diode cooled on two sides can be complicated since it may be difficult to access contact pads coupled to the laser diode. Additionally, multiple laser diodes can be arranged or packaged together to scale up the output power. However, it may be challenging to efficiently and effectively package and cool the multiple laser diodes on a platform.

The present disclosure provides methods, devices, and systems for implementing laser diode packaging platforms (or laser diode assemblies), which can significantly scale up an output power, improve emission and cooling efficiencies, and reduce cost. Implementations of the present disclosure can also provide compact packaging platforms for high-power, high-brightness laser diode modules, which can increase manufacturing volumes with high yield and low cost.

The laser diode packaging platforms can achieve lower thermal impedance and engineered thermomechanical stress in the laser diodes, which enables to achieve a higher output power and higher reliability of the laser diodes. The laser diode packaging platforms can be tested on a component level to sort out faulty devices prior to integration. The laser diode packing platforms enable high level of integration to minimize cost of auxiliary components (e.g., housing) and to maximize reliability by eliminating water connection and clamped contacts for each laser diode. The laser diode packaging platforms allow to serve multiple products using identical components.

In some implementations, a laser diode unit includes a laser diode or a laser diode bar arranged or sandwiched between two submounts, which allows engineered thermo-mechanical stress of the laser diode or the laser diode bar and testing prior to integration. The laser diode can include a single emitter, and the laser diode bar can include multiple single emitters (e.g., 4, 6, 8, 12, 16, or more). A laser diode packaging platform can arrange individual laser diode units next to each other on a heat sink such that the laser diode units are electrically connected in series. The laser diode packaging platform can include a micro-optics system for beam shaping that can be easily adapted in the packaging platform.

The laser diode packaging platform can be customized to different product lines. For example, the locations and the number of laser diode units in the laser diode packaging platform can be adjusted. The laser diode units can be also arranged in one or two dimensional arrangements for power scaling and double-sided cooling. For example, laser diode units can be packaged for double-sided cooling by mounting one side of each laser diode unit on a common heat sink and another side of the laser diode unit on an additional heat sink.

In some implementations, the laser diode or the laser diode bar is packaged with a hard soldering material (e.g., AuSn) between two submounts. The laser diode unit can be tested for performance and initial reliability. In some examples, the submounts are made of a material identical to the soldering material. In some examples, the submounts are made from a material that has a thermal expansion coefficient matched to that of the laser diode (e.g., CuW) or any other material (e.g., Cu, CuD, or ceramic) with good thermal and electrical conductivity. Dimensions and material properties of the submounts can be selected to result in a tailored distribution of thermo-mechanical stress in the laser diode or the laser diode bar after bonding.

In some examples, multiple laser diode units are arranged next to each other at an edge of a common heat sink and bonded to the heat sink, e.g., with hard solder in a single reflow process. In some examples, the laser diode units are mounted directly on the heat sink without any prior testing. The radiation emitted from the individual laser diode units can point in a same direction and collinear in both axes perpendicular to a propagation axis.

In some implementations, the common heat sink is made to be electrically insulate to the integrated cooling channels and manifolds. A mounting surface of the heat sink is structured in: 1) electrically insulated pads (or gaps) such that the heat sink provides mounting surfaces for the individual laser diodes and 2) electrically conductive pads for electrical contacts to connect the individual laser diodes in series. The laser diode packaging platform can reduce or eliminate the requirements for discrete water and current connections for each cooler or laser diode to thereby improve production yield and reliability.

The common heat sink can be configured such that the laser diode units can be attached to either side of the common heat sink thus further minimizing the production cost. The common heat sink can be also configured such that a second heat sink can be attached to a same type doped side (e.g., N side) of the laser diode units. The electrically conductive pads that are isolated in the common heat sink can be respectively configured to mechanically connect the laser diodes or laser diode bars in the laser diode units to the second heat sink and also to electrically connect all the laser diodes in series. In some implementations, the laser diode units are mounted on both sides of a first common heat sink, and a second heat sink and a third heat sink can be respectively attached to one side (e.g., N side) or both side (N side and P side) of the laser diode units.

A subsequent micro-optical system can be attached to each laser diode for beam shaping. For example, aspheric lenses can be attached to each laser diode for collimating light in a fast axis. The subsequent optical system can be configured to be specific to different applications, e.g., for various product lines.

In some implementations, a pump module for a laser diode includes two mirrors for the laser diode to place individual light beams on top of each other in the fast axis with a minimum beam height. The number of laser diodes on one heat sink can be selected such that the total height of the stacked light beams is slightly larger than the mechanical height of the laser diode packaging platform, while the desired output power are obtained. In some examples, a specific optical and mechanical arrangement for two dimensional stacking can be achieved.

In some implementations, in case of double-sided packaging of laser diode units on the heat sinks, two rows of laser diode units can be combined in one row by (i) polarization multiplexing or (ii) optical stacking one row into dark spaces of the other row, to obtain an optical filling factor close to 100%. This arrangement can be beneficial for multiple applications, e.g., dense wavelength multiplexing or line geometries.

In some implementations, a dense wavelength multiplexer or a beam twister is used for each laser diode bar, which can rotate each of individual emitters in the laser diode bar by 90 degrees to switch between fast axis and slow axis. The described arrangement of laser diodes on one heat sink next to each other with minimum spacing can be beneficial for wavelength multiplexing. Fiber coupling of each laser diode can be achieved after the beam twister focusing each laser beam into a smaller fiber (e.g., with a core size from 0.1 mm to 0.2 mm). Polarization multiplexing and/or optical stacking as described above can be also deployed for power scaling to achieve cost-effective and high power laser diode packaging platforms.

In some implementations, a modular high power laser diode packaging platform is achieved according to a process that can include multiple steps. First, individual laser diode units are formed by packaging individual laser diodes or laser diode bars between submounts for optimized thermo-mechanical stress and excellent cooling for optimum performance and reliability. The individual laser diode units can be tested individually prior to further integration. Second, integration of multiple laser diode units on an edge of a common heat sink that is electrically insulated to coolant, and the individual laser diode units are electrically connected in series. The common heat sink can be populated with the laser diode units on one or two sides. In such a way, the number of connections for water and current can be minimized. Third, double-sided cooling of the laser diodes or laser diode bars can be optionally implemented by attaching a second heat sink to same-type sides of the individual laser diode units. Fourth, one dimensional or two dimensional array of laser diode units can be formed in the laser diode packing platform, where the number of laser diode units can be adapted based on applications or requirements.

Figure 1A:
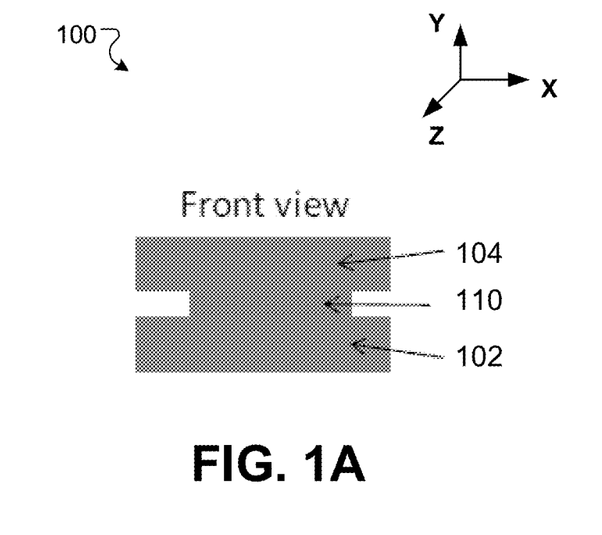
FIGS. 1A-1C illustrate an example of a laser diode unit including a laser diode mounted between two submounts.
Figure 1B:
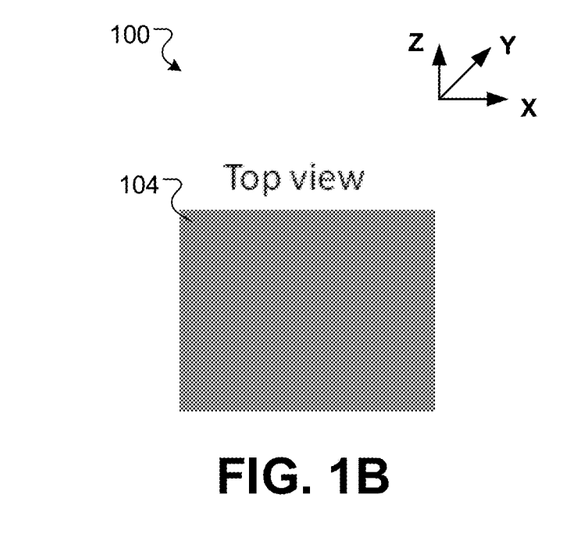
Figure 1C:
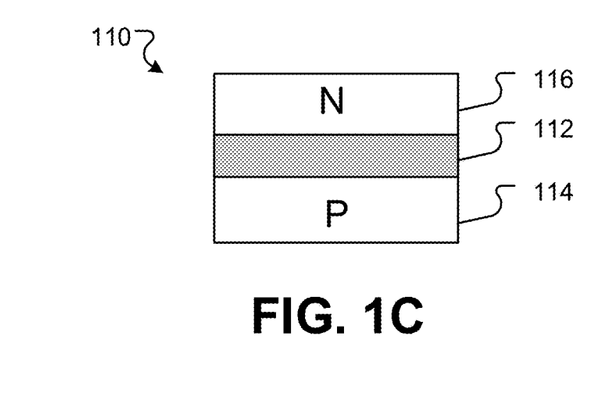

FIGS. 1A-1C illustrate an example of a laser diode unit 100 including a laser diode 110 mounted between two (first and second) submounts 102 and 104. The laser diode unit 100 can be cooled by heatsinks from double sides through the submounts 102 and 104.

In some implementations, the laser diode 110 is mounted with a soldering material (e.g., AuSn) on the submounts 102 and 104. In some examples, the submounts 102 and 104 are made of a material identical to the soldering material. In some examples, the submounts 102 and 104 are made from a material that has a thermal expansion coefficient matched to that of the laser diode 110. The material can be CuW or any other material (e.g., Cu, CuD, or ceramic) that has a good thermal conductivity and a good electrical conductivity. Dimensions and material properties of the submounts 102, 104 can be selected to result in a tailored distribution of thermo-mechanical stress in the laser diode 110 after bonding.

As FIG. 1C shows, the laser diode 110 includes an active layer 112 (e.g., made of a laser-active semiconductor material) between a first-type doped semiconductor layer 114 (e.g., P-doped layer) and a second-type doped semiconductor layer 116 (e.g., N-doped layer) and configured to emit laser light. The laser diode 110 has a bottom side corresponding to the first-type doped semiconductor layer 114, e.g., p-doped layer, and a top side corresponding to the second-type doped semiconductor layer 116, e.g., n-doped layer. The bottom side (e.g., P side) of the laser diode 110 is positioned on the first submount 102, and the second submount 104 is positioned on top of the top side (e.g., N side) of the laser diode 110. The submounts 102 and 104 can be made of electrically conductive material, such that the laser diode 110 can be electrically connected with another laser diode via the submounts 102 and 104.

The laser diode 110 includes front and rear facets, e.g., on X-Y plane. The laser diode 110 can be configured to emit a laser light beam from at least one of the facets, e.g., from the front facet only, or from both the front and rear facets. The emitted light beam is along a direction perpendicular to the facet(s), e.g., Z direction. In some implementations, the rear facet has a substantially higher reflectivity than the front facet, and the laser diode 110 is configured to emit the light beam the front facet. In some implementations, the rear facet has a reflectivity substantially same as the front facet, and the laser diode 110 is configured to emit a first light beam from the front facet and a second light beam from the rear facet. In some implementations, the facet(s) of the laser diode 110 is aligned with side surfaces of the submounts in the XY plane along the Z direction, such that the light beam is emitted from an edge of the laser diode unit 100.

As shown in FIGS. 1A and 1B, each of the submounts 102, 104 has a size (e.g., an area) larger than that of the laser diode 110, such that the laser diode 110 can be fully covered the submounts 102, 104 for thermal cooling and electrical connection. The first submount 102, the laser diode 110, and the second submount 104 in the laser diode unit 100 can be sequentially positioned along a vertical direction (e.g., Y direction). The laser diode 110 can be in the form of a single-emitter laser diode chip. The laser diode chip can have a slow axis along a horizontal direction (e.g., X direction) and a fast axis along the vertical direction (e.g., Y direction). In some examples, the chip has a dimension of 0.6 mm in width (along X direction), 0.1 mm in height (along Y direction), and 5 mm in length (along Z direction). In some examples, the laser diode unit 100 has a height of 2 mm along the vertical direction (e.g., Y direction).

In some implementations, a plurality of individual single emitters (e.g., 4, 6, 8, 12, 16 or more) form a laser diode bar that can be mounted between two submounts. The single emitters in the laser diode bar are spaced apart from each other along the horizontal direction, e.g., X direction. The single emitters can be electrically connected in series in the laser diode bar. In a first example, a light beam emitted from each single emitter in the laser diode bar has a slow axis along the horizontal direction (e.g., X direction) and a fast axis along the vertical direction (e.g., Y direction). In a second example, a light beam from each single emitter in the laser diode bar is rotated by a beam twister by 90 degrees with respect to that from the single emitter in the first example. The light beam has a slow axis along the vertical direction (e.g., Y direction) and a fast axis along the horizontal direction (e.g., X direction). The light beams from the individual emitters in the laser diode bar can be optically stacked along the fast axis (or the horizontal direction).

Figure 2A:
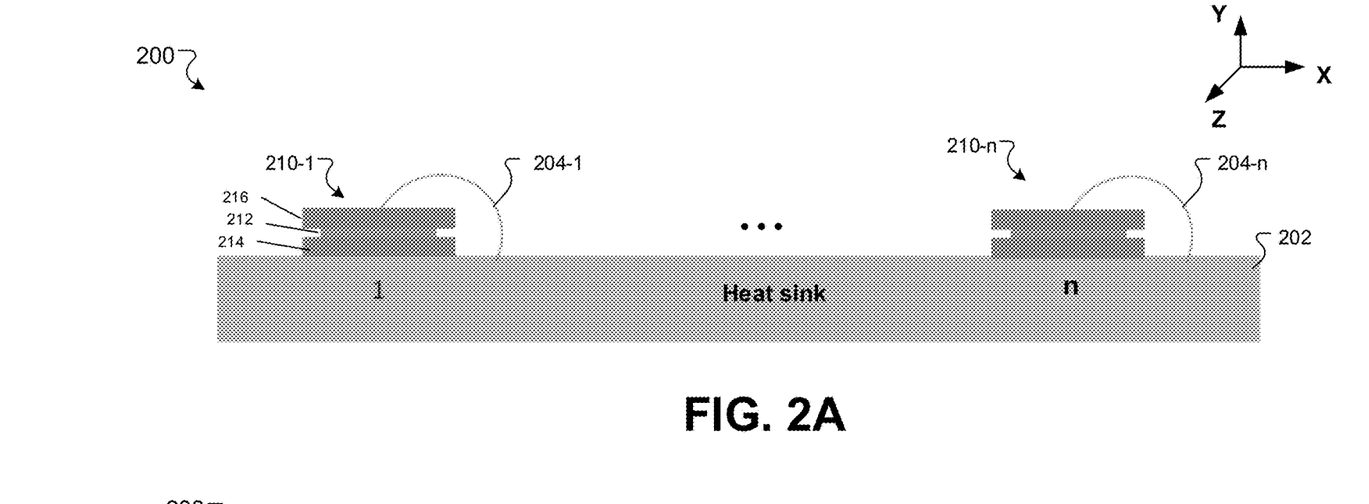
FIGS. 2A-2B illustrate an example of a laser diode packaging platform for integrating multiple laser diode units on a heat sink.
Figure 2B:
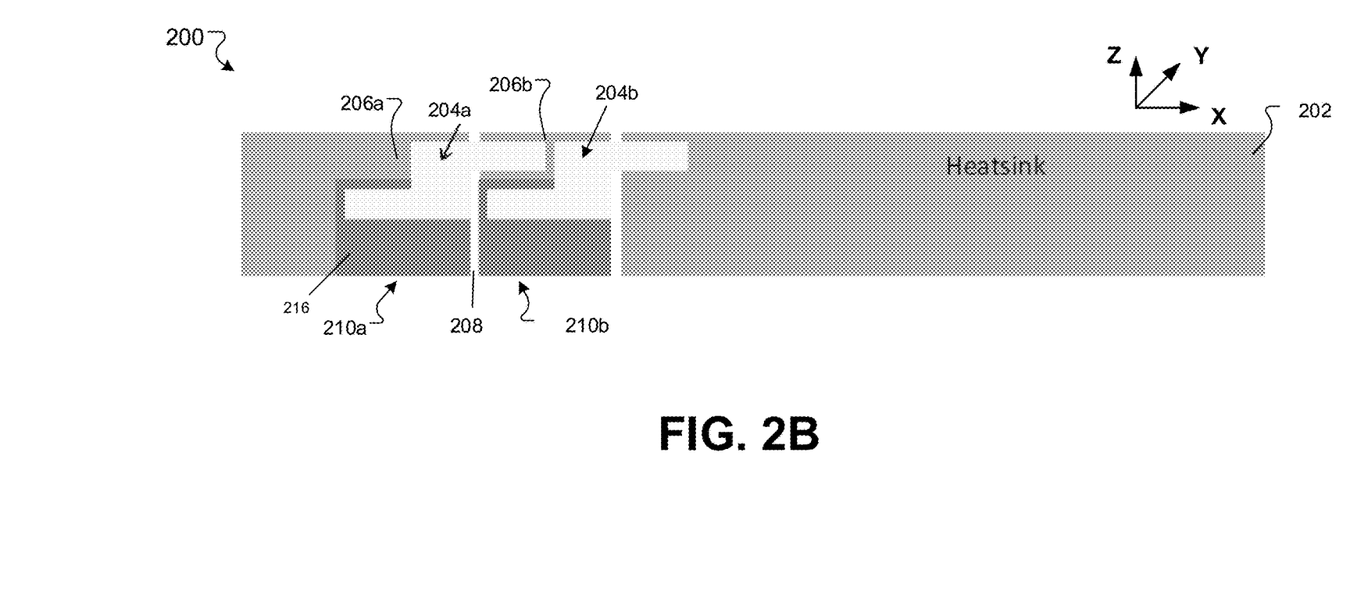

FIGS. 2A-2B illustrate an example of a laser diode packaging platform (or a laser diode assembly) 200 for integrating multiple laser diode units (e.g., from 1 to n) on a heat sink 202 along a horizontal direction (e.g., X direction). The multiple laser diode units 210-1, . . . , 210-$n$ (referred to generally as laser diode units 210 and individually as a laser diode unit 210) are spaced apart from one another along the horizontal direction on the heat sink 202. The laser diode units 210 are electrically connected in series in the laser diode packing platform 200.

Each laser diode unit 210 can be the laser diode unit 100 of FIGS. 1A-1C. Each laser diode unit 210 includes a laser diode (or a laser diode bar) 212 (e.g., the laser diode 110 of FIG. 1A) mounted between a bottom submount 214 (e.g., the submount 102 of FIG. 1A) and a top submount 216 (e.g., the submount 104 of FIG. 1A). The submounts 214 and 216 are electrically conductive. The laser diodes 212 of the laser diode units 210 are electrically connected in series in the laser diode packing platform 200.

The heat sink 202 can include, e.g., an integrated cooler device that has one or more integrated internal coolant passages, as well as an electrically conductive mounting layer separated from the integrated coolant passages by an electrically insulating layer. The laser diode unit 210 can be mounted on the heat sink 202, e.g., by eutectic bonding. The heat sink 202 has an edge extending along the horizontal direction (e.g., X direction), and the laser diode unit 210 can be aligned with the edge of the heat sink 202, such that facets of laser diodes 212 are aligned with and adjacent to the edge of the heat sink 202.

The heat sink 202 is electrically insulated, e.g., made of an electrically insulated material with good thermal conductivity. As illustrated in FIG. 2B, the laser diode packing platform 200 includes a plurality of electrical contact pads 206a, 206b (referred to generally as electrical contact pads 206 and individually as an electrical contact pad 206) spaced apart from one another along the horizontal direction on the heat sink 202, e.g., by patterned metallization. Each electrical contact pad 206 is electrically insulated (or isolated) from each other, e.g., by a physical electrically insulated area 208 between adjacent electrical contact pads 206. The physical electrically insulated area 208 can be a physical gap between the electrical contact pads 206 on the heat sink 202 or an electrically insulated pad on the area 208 patterned on the heat sink 202. For each laser diode unit 210, the bottom submount 214 is mounted on a different corresponding electrical contact pad 206 and spaced apart from adjacent bottom submount in an adjacent laser diode unit, e.g., by at least the area 208.

The laser diode packing platform 200 can further include a plurality of electrical contact bar 204a, 204b (referred to generally as electrical contact bars 204 and individually as an electrical contact bar 204). Each electrical contact bar 204 can be a bus bar or a wirebond (including one or more bonding wires). At least one electrical contact bar 204 provides a serial electrical connection between adjacent laser diode units 210.

For example, as illustrated in FIG. 2B, a first laser diode unit 210a and a second laser diode unit 210b are adjacent to each other and are electrically connected by electrically connecting the top submount 216 of the first laser diode unit 210a to the bottom submount 214 of the second laser diode unit 210b sequentially through the electrical contact bar 204a and the electrical conductive pad 206b. As the bottom and top submounts 214, 216 are electrically conductive, adjacent laser diodes 212 in the adjacent first and second laser diode unit 210a, 210b are also electrically connected. In such a way, the laser diodes 212 in the laser diode units 210 can be electrically connected in series in the laser diode packing platform 200.

A beginning laser diode unit of the laser diode units 210 can be electrically connected to a first terminal (e.g., a positive terminal) of a power source (e.g., a voltage source or a current source) by connecting a corresponding electrical contact pad 206 to the first terminal. An ending laser diode unit of the laser diode units 210 can be electrically connected to a second terminal (e.g., a negative terminal) of the power source by connecting a corresponding electrical contact bar 204 to the second terminal.

Figure 3A:
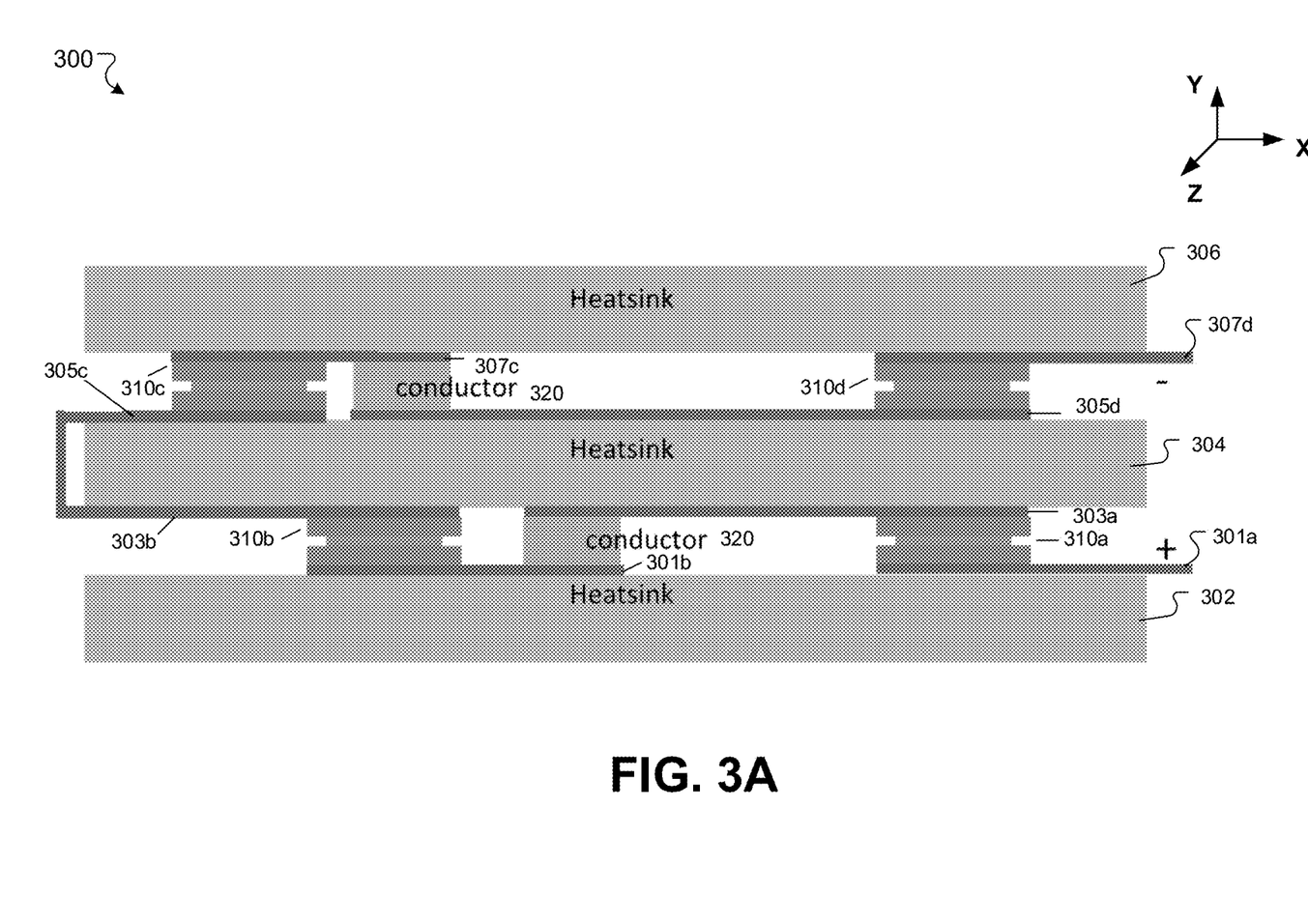
FIG. 3A is a schematic illustrating another example of a laser diode packaging platform for integrating multiple stacks of laser diode units on heat sinks.

FIG. 3A is a schematic illustrating another example of a laser diode packaging platform 300 for integrating multiple stacks of laser diode units on heat sinks. The laser diode packing platform 300 can integrate a number of laser diode units in two dimensions (e.g., in XY plane), which not only scale up an output power of the laser diode packing platform 300 but also enable double-sided cooling of laser diodes in the laser diode units. The laser diode units in multiple stacks are electrically connected in series, e.g., to two (positive and negative) terminals of a power source (e.g., a voltage source or a current source).

The laser diode packaging platform 300 includes a plurality of laser diode units 310a, 310b, 310c, 310d (referred to generally as laser diode units 310 and individually as a laser diode unit 310). Each laser diode unit 310 can be the laser diode unit 100 of FIGS. 1A-1C. Each laser diode unit 310 includes a laser diode (e.g., the laser diode 110 of FIGS. 1A-1C) or a laser diode bar that is arranged between a bottom submount (e.g., the submount 102 of FIG. 1A) and a top submount (e.g., the submount 104 of FIG. 1A). As an example, four laser diodes 310 are arranged in two stacks as illustrated in FIG. 3A. However, a different number of laser diode units can be included in two or more stacks in the laser diode packaging platform 300. The number of laser diode units in each stack can be the same or different.

The laser diode packaging platform 300 includes a first heat sink 302, a second heat sink 304, and a third heat sink 306. Each of the heat sinks 302, 304, 306 can be the heat sink 202 of FIGS. 2A-2B. Each heat sink 302, 304, 306 is electrically insulated. The laser diode packing platform 300 include a plurality of electrical contact pads formed on surfaces of the heat sinks 302, 304, 306 on both sides or just one side, e.g., by patterned metallization. The electrical contact pads on a side of a heat sink are spaced and electrically isolated from one another.

For example, as illustrated in FIG. 3A, electrical contact pads 301a, 301b (referred to generally as electrical contact pads 301 and individually as an electrical contact pad 301) are formed and spaced apart from each other on a top surface of the first heat sink 302. Electrical contact pads 303a, 303b (referred to generally as electrical contact pads 303 and individually as an electrical contact pad 303) are formed and spaced apart from each other on a bottom surface of the second heat sink 304. Electrical contact pads 305c, 305d (referred to generally as electrical contact pads 305 and individually as an electrical contact pad 305) are formed and spaced apart from each other on a top surface of the second heat sink 304. Electrical contact pads 307c, 307d (referred to generally as electrical contact pads 307 and individually as an electrical contact pad 307) are formed and spaced apart from each other on a bottom surface of the third heat sink 306.

The laser diode units 310 can be arranged in multiple stacks among the heat sinks 302, 304, 306. The second heat sink 304 can be a common heat sink for the laser diode units 310. As an example, the laser diode units 310a, 310b are arranged between and cooled by the first heat sink 302 and the second heat sink 304. In some implementations, the bottom submounts of the laser diode units 310a, 310b are mounted on different corresponding electrical contact pads 301a, 301b on the first heat sink 302, and the top submounts of the laser diode units 310a, 310b are mounted on different corresponding electrical contact pads 303a, 303b on the second heat sink 304. As another example, the laser diode units 310c, 310d are arranged between and cooled by the second heat sink 302 and the third heat sink 304. The bottom submounts of the laser diode units 310c, 310d are mounted on different corresponding electrical contact pads 305c, 305d on the first heat sink 302, and the top submounts of the laser diode units 310c, 310d are mounted on different corresponding electrical contact pads 307c, 307d on the second heat sink 304.

The laser diode packaging platform 300 includes a plurality of vertical electrical contacts (or conductors) 320 arranged between two heat sinks, and each vertical electrical contact 320 provides a direct electrical connection between adjacent laser diode units 310. The vertical electrical contact 320 can include a doped material (e.g., P doped) same as a bottom layer (e.g., P doped layer) of the laser diode in the laser diode unit 310. In some implementations, a laser diode unit 310 and a vertical electrical contact 320 form a pair and are both bonded on a same electrical contact pad on a heat sink. The laser diode unit 310 and the vertical electrical contact 320 are spaced from each other on the electrical contact pad by a physical gap. Opposite surfaces of adjacent heat sinks are substantially parallel to each other. The vertical electrical contact 320 and the laser diode unit 310 can have a substantially same height along the vertical direction (e.g., Y direction) between the opposite surfaces of the adjacent heat sinks.

As illustrated in FIG. 3A, as an example, the laser diode packaging platform 300 includes a first vertical electrical contact 320 between the first heat sink 302 and the second heat sink 304 and in contact with corresponding contact pads 301b and 303a. Thus, the first vertical electrical contact 320 provides a direct electrical connection between the corresponding electrical contact pads 301b and 303a, such that the laser diodes in the laser diode units 310a, 310b are electrically connected. As another example, the laser diode packaging platform 300 includes a second vertical electrical contact 320 between the second heat sink 304 and the third heat sink 306 and in contact with corresponding contact pads 307c and 305d. Thus, the second vertical electrical contact 320 provides a direct electrical connection between the corresponding electrical contact pads 307c and 305d, such that the laser diodes in the laser diode units 310c, 310d are electrically connected.

Laser diode units on adjacent stacks can be electrically connected by connecting corresponding electrical contact pads on opposite surfaces of a common heat sink. For example, as illustrated in FIG. 3A, the laser diode unit 310b between the first and second heat sinks 302 and 304 is electrically connected to the laser diode unit 310c between the second and third heat sinks 304 and 306 by connecting the electrical contact pad 303b on the bottom surface of the second heat sink 304 and the electrical contact pad 305c on the top surface of the second heat sink 304. In such a way, all the laser diode units 310 in the laser diode packaging platform 300 can be electrically connected in series. Two ends of the serial connected laser diode units 310 can be coupled to two (positive and negative) terminals of the power source.

Figure 3B:
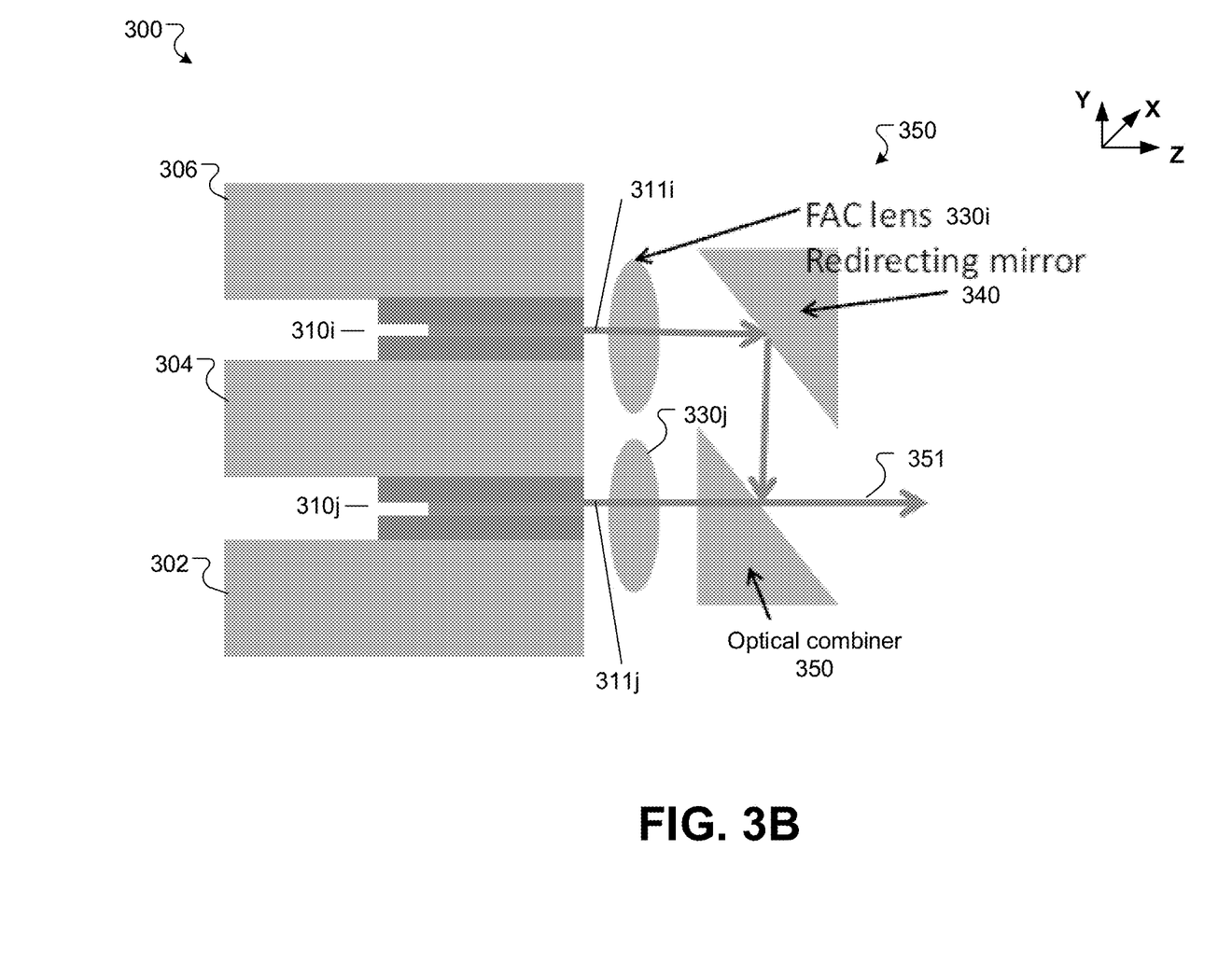
FIG. 3B is a side view of FIG. 3A illustrating an optical system for combining laser light beams from the multiple stacks of laser diode units.

FIG. 3B is a side view of FIG. 3A illustrating an optical system 350 for combining laser light beams from the multiple stacks of the laser diode units 310. Each heat sink 302, 304, 306 has an edge extending along the horizontal direction (e.g., X direction). The edges of the heat sinks 302, 304, 306 can be aligned with each other along Z direction, such that facets of adjacent laser diode units 310 on adjacent stacks are also aligned along the edges. As illustrated in FIG. 3B, laser diode units 310i and 310j are positioned on opposite sides of the second heat sink 304 along the vertical direction (e.g., Y direction). Laser light beams 311i and 311j emitted from laser diodes of the laser diode units 310i and 310j are combined together by the optical system 350 to form a combined light beam 351 propagating along the Z direction.

The optical system 350 can include micro-optics components. The optical system 350 can include a different corresponding fast-axis collimating (FAC) lens for each laser diode unit 310. For example, the optical system 350 includes a first FAC lens 330i for collimating the light beam 311i along a fast axis of the light beam 311i (e.g., Y direction) and a second FAC lens 330j for collimating the light beam 311j along a fast axis of the light beam 311j that is substantially parallel to the fast axis of the light beam 311i. The optical system 350 can further include a redirecting mirror 340 and an optical combiner 350 (e.g., a prism). The redirecting mirror 340 is arranged downstream the first FAC lens 330i and configured to reflect the light beam 311i collimated by the first FAC lens 330i to the optical combiner 350.

The optical combiner 350 can be arranged downstream the second FAC lens 330j and configured to transmit the light beam 311j collimated by the second FAC lens 330j. The optical combiner 350 can be configured to redirect the light beam 311i from the redirecting mirror 340 towards a direction along the light beam 311j, e.g., the Z direction. In some examples, the optical combiner 350 is configured to optically multiplex the light beams 311i, 311j by polarization multiplexing, e.g., by using a polarized beam splitter. In some examples, the optical combiner 350 is configured to optically stack the light beams 311i, 311j, e.g., along the fast axis. The light beams 311i, 311j can be stacked along the fast axis without overlapping or with partial overlapping.

Figure 4A:
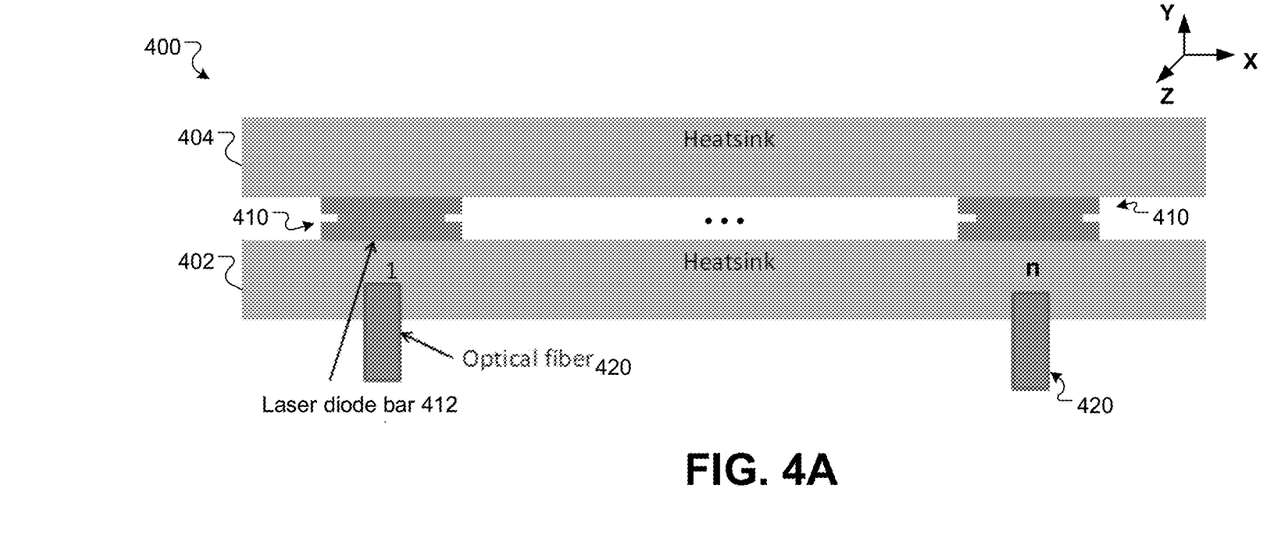
FIG. 4A is a schematic illustrating another example of a laser diode packaging platform for integrating multiple laser diode units including laser diode bars.

FIG. 4A is a schematic illustrating another example of a laser diode packaging platform 400 for integrating a number of laser diode units 410 (e.g., from 1 to n). The laser diode units 410 are arranged between two heat sinks 402 and 404 for double-sided cooling. Each heat sink 402, 404 can be the heat sink 202 of FIGS. 2A-2B. Each heat sink 402, 404 includes a mounting surface deposited with a plurality of electrical contact pads that are electrically insulated from one another along a horizontal direction (e.g., X direction). The laser diode units 410 are mounted on different corresponding electrical contact pads on the mounting surfaces of the heat sinks 402, 404. The laser diode units 410 are electrically connected in series in the laser diode packaging platform 400.

Each laser diode unit 410 includes a laser diode bar 412 mounted between two submounts (e.g., the submounts 102 and 104 of FIG. 1A or 214 and 216 of FIG. 2A). The laser diode bar 412 includes a number of individual emitters (e.g., 4, 6, 8, 12, 16 or more) arranged between the two submounts and distributed along the horizontal direction (e.g., X direction). A light beam from each emitter in the laser diode bar 412 can be rotated by a beam twister by 90 degrees, such that the rotated light beam has a fast axis along the horizontal direction (e.g., X direction) and a slow axis along a vertical direction (e.g., Y direction). For each laser diode unit 410, laser light beams 411 emitted from the number of individual emitters in the laser diode bar 412 are coupled into a corresponding optical fiber 420.

Figure 4B:
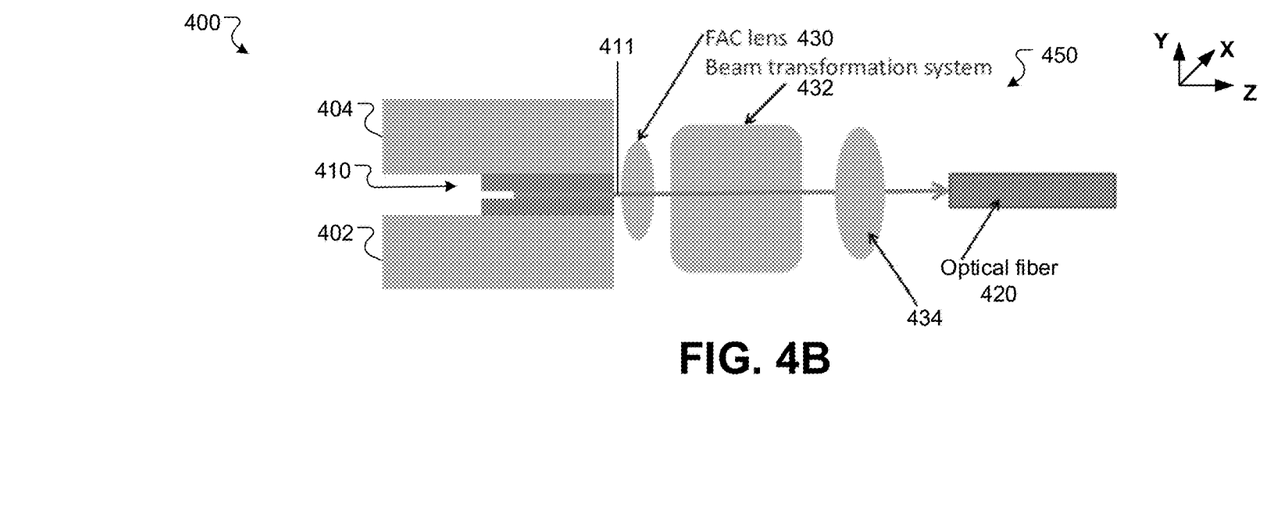
FIG. 4B is a side view of FIG. 4A illustrating an optical system for coupling laser light beams from a laser diode bar into an optical fiber.

FIG. 4B is a side view of FIG. 4A illustrating an optical system 450 for coupling the laser light beams 411 from the number of emitters of the laser diode bar 412 into the optical fiber 420. The laser diode packaging platform 400 can include a plurality of optical systems 350. Each laser diode unit 410 can be associated with a different corresponding optical system 450. Each heat sink 402, 404 has an edge extending along the horizontal direction (e.g., X direction). The edges of the heat sinks 402, 404 can be aligned with each other along Z direction, such that facets of the emitters in the laser diode bar 412 are also aligned along the edges.

The optical system 450 can include micro-optics components. The optical system 450 can include an FAC lens 430 for collimating the light beams 411 from the number of emitters along a fast axis of the light beams 411 (e.g., X direction). The collimated light beams 411 from the multiple emitters can be stacked along the fast axis, e.g., along X direction. The optical system 450 can further include a beam transformation system 432 arranged downstream the FAC lens 430 for beam shaping the collimated light beams 411. The optical system 450 can include a focusing component 434 (e.g., an optical lens) for focusing the shaped light beams 411 into the optical fiber 420.

Figure 5A:
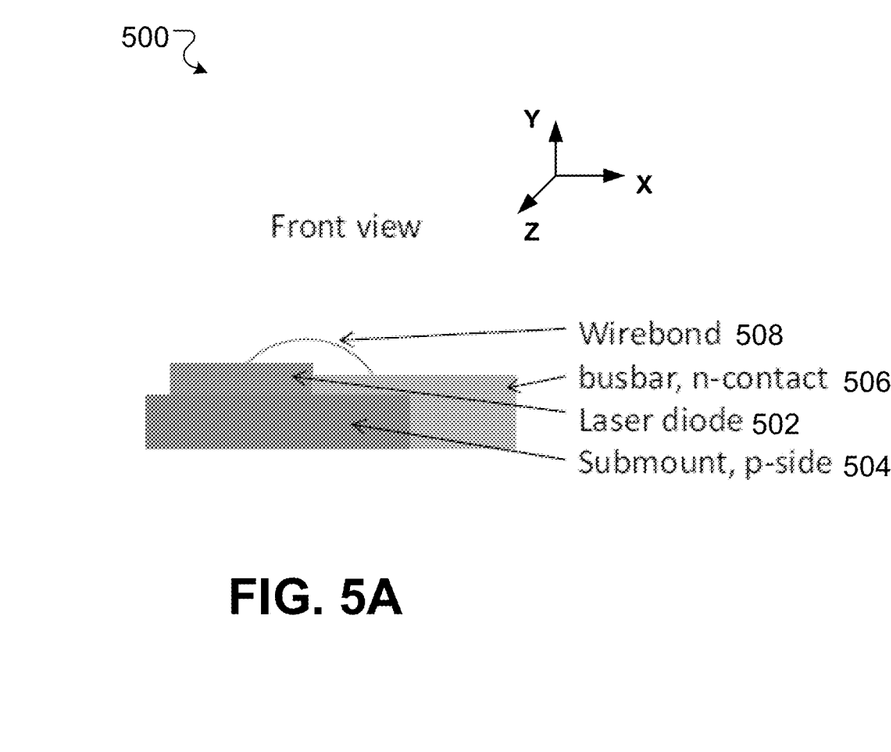
FIGS. 5A-5B illustrate another example of a laser diode unit including a laser diode mounted on a submount.
Figure 5B:
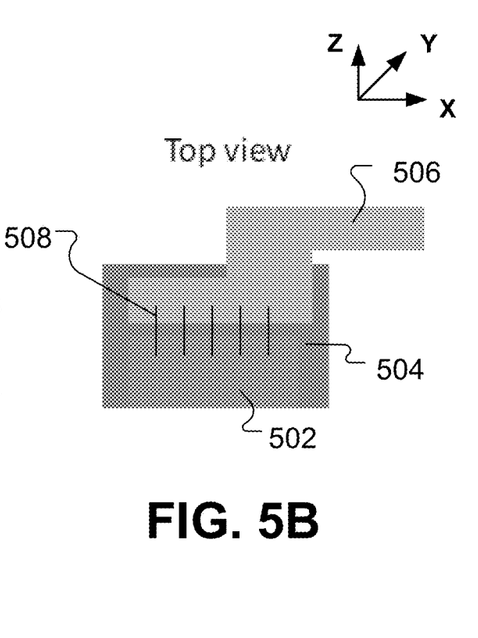

FIGS. 5A-5B illustrate another example of a laser diode unit 500 including a laser diode 502 mounted on a submount 504. The laser diode 502 can be the laser diode 110 of FIGS. 1A-1C. The submount 504 can the submount 102 of FIG. 1A. The submount is electrically conductive. A bottom side (e.g., P side) of the laser diode 502 is mounted on a top surface of the submount 504.

The laser diode unit 500 includes an electrical contact bar 506 bonded on the top surface of the submount 504. The electrical contact bar 506 can be spaced from the laser diode 502, e.g., along Z direction, on the top surface of the submount 504. The laser diode unit 500 further includes a wirebond 508 configured to electrically connect a top side of the laser diode 502 to the electrical contact bar 506. The wirebond 508 can include one or more bonding wires. The electrical contact bar 506 can be a bus bar or a wirebond. The electrical contact bar 506 is configured to electrically connect the laser diode unit 500 to another adjacent laser diode unit, e.g., along a horizontal direction such as X direction.

As illustrated in FIG. 5B, a facet of the laser diode 502 is aligned with an edge (or a side surface) of the submount 504 in the XY plane, such that a light beam is emitted from an edge of the laser diode unit 500. In some implementations, the laser diode unit 500 includes a laser diode bar including multiple emitters on the submount 504. Each emitter can be individually connected to the electrical contact bar 506 via a respective bonding wire.

Figure 6A:
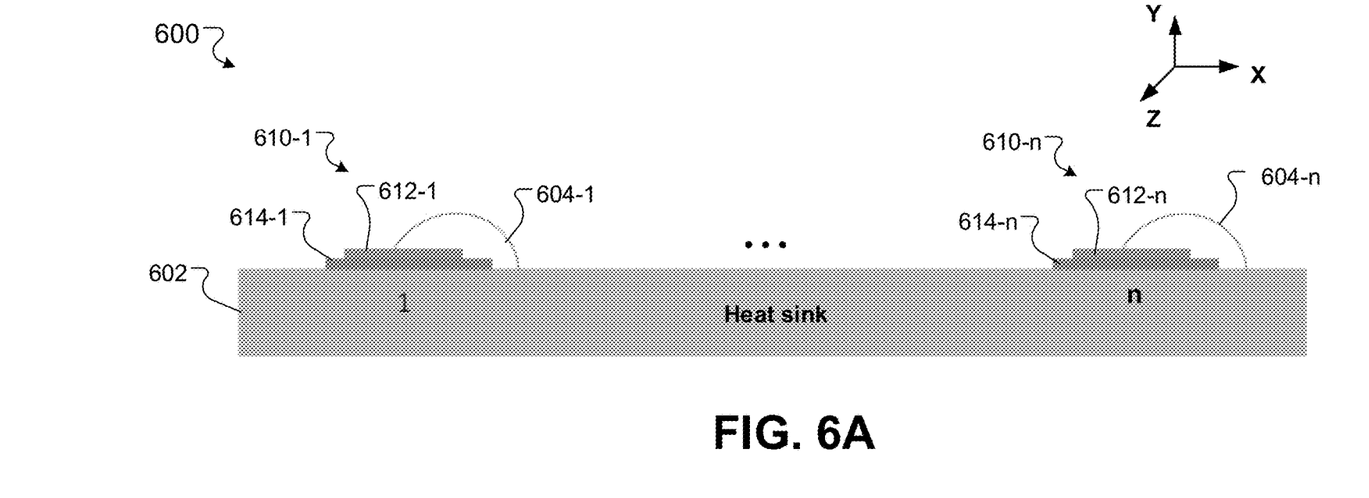
FIGS. 6A-6B illustrate another example of a laser diode packaging platform for integrating multiple laser diode units on a heat sink.
Figure 6B:
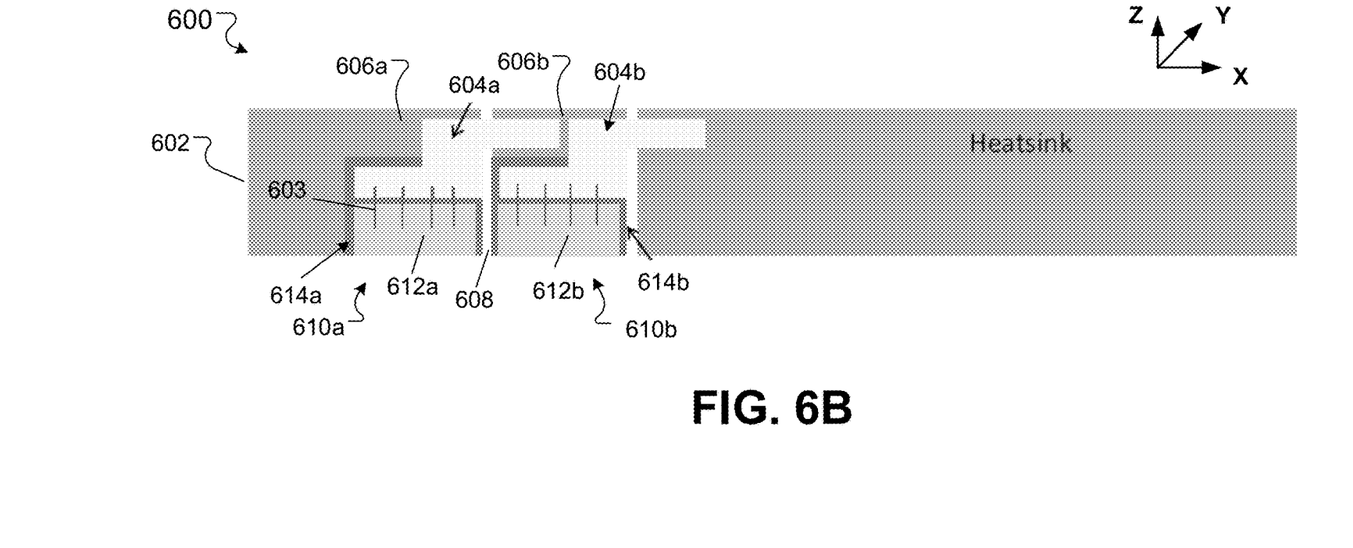

FIGS. 6A-6B illustrate another example of a laser diode packaging platform 600 for integrating a number of laser diode units (e.g., from 1 to n) on a heat sink 602 along a horizontal direction (e.g., X direction). The laser diode units 610-1, . . . , 610-n (referred to generally as laser diode units 610 and individually as a laser diode unit 610) are spaced apart from one another on the heat sink 602. The laser diode units 610 are electrically connected in series in the laser diode packing platform 600.

Each laser diode unit 610 can be the laser diode unit 500 of FIGS. 5A-5B. Each laser diode unit 610-1, . . . , 610-n includes a laser diode (or a laser diode bar) 612-1, . . . , 612-n (referred to generally as laser diode 612 and individually as a laser diode 612) mounted between a submount 614-1, . . . , 614-n (referred to generally as submounts 614 and individually as a submount 614). The laser diode 612 can be the laser diode 502 of FIGS. 5A-5B. The submount 614 can be the submount 504 of FIGS. 5A-5B. The submount 614 is electrically conductive.

The heat sink 602 can be the heat sink 202 of FIGS. 2A-2B. The laser diode unit 610 can be mounted on the heat sink 602, e.g., by eutectic bonding. The heat sink 602 has an edge extending along the horizontal direction (e.g., X direction), and the laser diode unit 610 can be aligned with the edge of the heat sink 602, such that facets of laser diodes 612 are aligned with and adjacent to the edge of the heat sink 602.

The heat sink 602 is electrically insulated, e.g., made of an electrically insulated material with good thermal conductivity. As illustrated in FIG. 6B, the laser diode packing platform 600 includes a plurality of electrical contact pads 606a, 606b (referred to generally as electrical contact pads 606 and individually as an electrical contact pad 606) spaced apart from one another along the horizontal direction on the heat sink 602, e.g., by patterned metallization. Each electrical contact pad 606 is electrically insulated from each other, e.g., by a physical electrically insulated area 608 between adjacent electrical contact pads 606. The area 608 can be a physical gap between the adjacent electrical contact pads 606 on the heat sink 602 or an electrically insulated pad on the area 608 patterned on the heat sink 602. For each laser diode unit 610, the submount 614 is mounted on a different corresponding electrical contact pad 606 and spaced apart from adjacent submount in an adjacent laser diode unit, e.g., by at least the area 608.

The laser diode packing platform 600 can further include a plurality of electrical contact bar 604a, 604b (referred to generally as electrical contact bars 604 and individually as an electrical contact bar 604). Each electrical contact bar 604 can be a bus bar or a wirebond. At least one electrical contact bar 604 provides a serial electrical connection between adjacent laser diode units 610.

For each laser diode unit 610, a bottom side of the laser diode 612 is bonded on a top surface of the submount 614. An electrical contact bar 604 is bonded on the top surface of the submount 614, and can be spaced from the bottom side of the laser diode 502, e.g., along Z direction, on the top surface of the submount 504. Similar to the laser diode unit 500 of FIGS. 5A-5B, the laser diode unit 610 further includes a wirebond 603 configured to electrically connect a top side of the laser diode 612 to the electrical contact bar 604. The wirebond 603 can include one or more bonding wires.

As illustrated in FIG. 6B, a first laser diode unit 610a and a second laser diode unit 610b are mounted on adjacent electrical contact pads 606a, 606b on the heat sink 602 and are electrically connected. A top side of a first laser diode 612a is electrically connected to a first electrical contact bar 604 via a wirebond 603; the first electrical contact bar 604 is electrically connected to the electrical contact pad 606b that is electrically connected to a bottom side of a second laser diode 612b of the second laser diode unit 610b through the submount 614b of the second laser diode unit 610b. In such a way, the laser diodes 612 in the laser diode units 610 can be electrically connected in series along the horizontal direction in the laser diode packing platform 600.

Figure 7A:
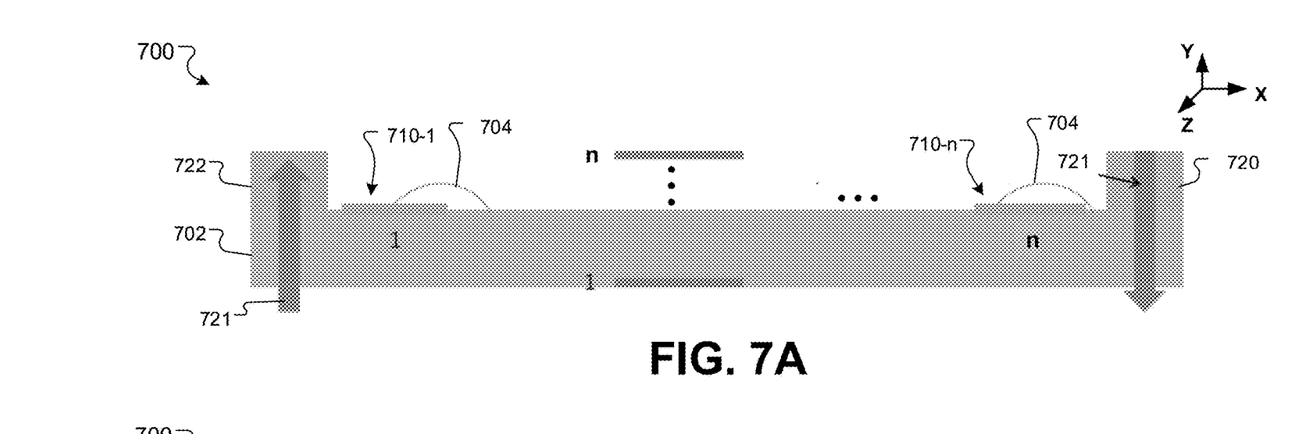
FIGS. 7A-7B illustrate another example of a laser diode packaging platform for integrating multiple laser diode units on a heat sink.
Figure 7B:
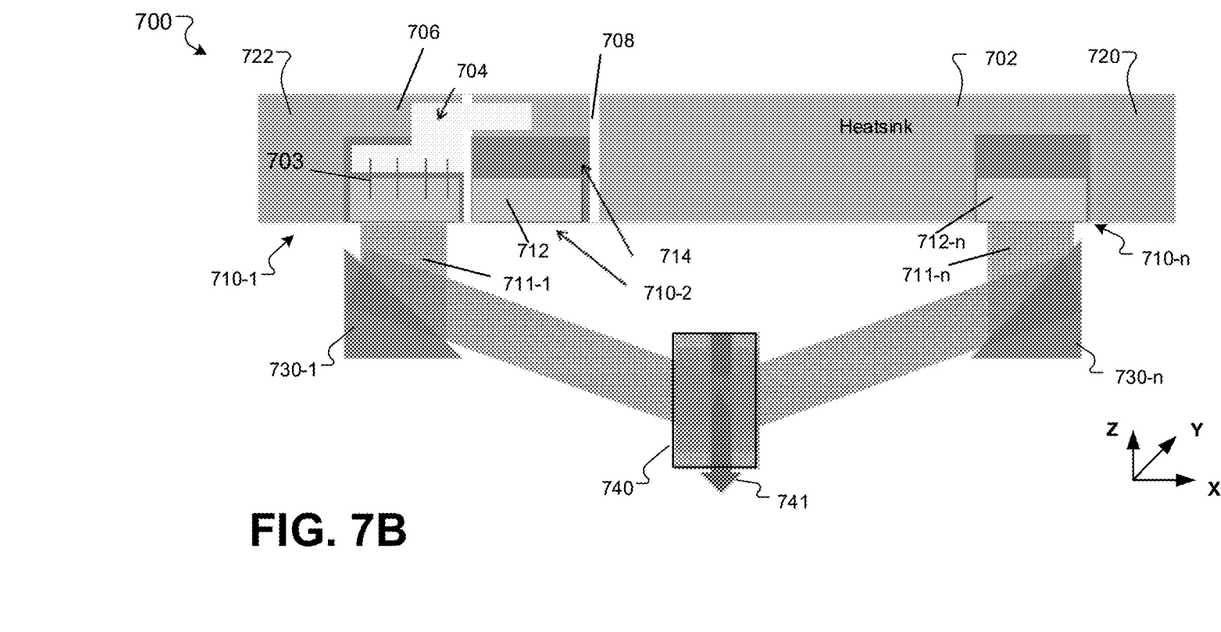

FIGS. 7A-7B illustrate another example of a laser diode packaging platform 700 for integrating a number of laser diode units (e.g., from 1 to n) on a heat sink 702 along a horizontal direction (e.g., X direction). The laser diode units are electrically connected in series. Laser light beams from the laser diode units can be stacked along a vertical direction (e.g., Y direction).

The heat sink 702 includes an integrated cooling passage (e.g., a fluid manifold) that has an inlet 720 for coupling in a fluid (or coolant) 721 (e.g., water) and an outlet 722 for coupling out the fluid 721. The inlet 720 and the outlet 722 are arranged on two ends of the heat sink 702 so that the fluid 721 is through the heat sink 702. The inlet 720 and the outlet 722 can be positioned on a top surface of the heat sink 702 with a height along a vertical direction (e.g., Y direction).

The laser diode units 710-1, . . . , 710-n (referred to generally as laser diode units 710 and individually as a laser diode unit 710) are spaced apart from each other on the heat sink 702. Each laser diode unit 710 can be the laser diode unit 610 of FIGS. 6A-6B. Each laser diode unit 710 includes a laser diode (or a laser diode bar) 712 mounted on a submount 714. The heat sink 702 can be the heat sink 602 of FIG. 6A-6B and can be deposited with a plurality of electrical contact pads 706 that are electrically isolated by an area 708, e.g., the area 608 of FIG. 6B. Each laser diode unit 710 can also include a wirebond 703 for electrically connecting the laser diode 712 to an electrical contact bar 704. The electrical contact bar 704 is electrically connected to an adjacent electrical contact pad 706 to thereby provide an electrical connection between adjacent laser diode units 710.

Similar to the laser diode packaging platform 600 of FIGS. 6A-6B, in the laser diode packaging platform 700, facets of the laser diodes 712 are aligned with an edge of the heat sink 702, such that laser light beams 711-1, . . . , 711-n (referred to generally as laser light beams 711 and individually as a laser light beam 711) are directly emitted from the laser diode units 710 along Z direction. As illustrated in FIG. 7B, the laser light beam 711 from each laser diode unit 710 is redirected by a different corresponding redirecting mirror 730-1, . . . , or 730-n (referred to generally as redirecting mirrors 730 and individually as a reflecting mirror 730) to an optical combiner 740. The optical combiner 740 can be positioned in a middle position of the laser diode packaging platform 700 and configured to generate a combined optical beam 741.

The redirecting mirrors 730 can be configured such that the laser light beams 711 are vertically stacked along a fast axis (e.g., along Y direction). The laser light beams 711 can be spaced apart without overlapping or with partial overlapping. A height of the stacked laser light beams 711 can be slightly larger than a sum of the height of the inlet 720 or outlet 722 and a height of the heat sink 702. The height of the inlet 720 or outlet 722 can be adjusted based on the height of the stacked laser light beams 711.

In some implementations, as illustrated in FIGS. 4A-4B, each laser diode unit 710 includes a laser diode bar (e.g., the laser diode bar 412 of FIG. 4A) that has a number of individual emitters and beam twisters. Each beam twister is configured to rotate a light beam from a corresponding emitter to have a fast axis along the horizontal direction (X direction) and a slow axis along the vertical direction (Y direction). Thus, light beams emitted from the emitters in the laser diode bar can be optically multiplexed or optically stacked along the fast axis, e.g., along the horizontal direction (X direction). As the light beams 711 from different laser diode units 710 can be stacked along the vertical direction (Y direction) by the redirecting mirrors 730, the light beams from the rotated emitters of the laser diode bars of the laser diode units 710 can be stacked in two dimensions, along both the horizontal direction (X direction) and the vertical direction (Y direction), which can greatly scale up an output power of the laser diode packaging platform 700.

A number of embodiments of the invention have been described. Nevertheless, it will be understood that various modifications may be made without departing from the spirit and scope of the invention. Accordingly, other embodiments are within the scope of the following claims.

What is claimed is:

1. A laser diode assembly comprising:
   a first heat sink extending along a horizontal direction;
   a second heat sink arranged above the first heat sink in a vertical direction, and extending along the horizontal direction;
   a third heat sink arranged above the second heat sink in the vertical direction, and extending along the horizontal direction;
   a first plurality of laser diode units spaced apart from one another along the horizontal direction en between the first heat sink and the second heat sink, each laser diode unit of the first plurality of laser diode units comprising:
      a first submount positioned on the first heat sink;
      a laser diode comprising an active layer between a first-type doped semiconductor layer and a second-type doped semiconductor layer, a bottom side of the laser diode being positioned on the first submount; and
      a second submount positioned on a top side of the laser diode,
      wherein the first submount, the laser diode, and the second submount in the laser diode unit are sequentially positioned on the first heat sink along a vertical direction perpendicular to the horizontal direction, and
      wherein the laser diodes of the first plurality of laser diode units are electrically connected in series;
   a first plurality of vertical conductors between the first heat sink and the second heat sink, wherein each vertical conductor of the first plurality of vertical conductors is between a pair of adjacent laser diode units along the horizontal direction, extends vertically between the first heat sink and the second heat sink, and provides an electrical connection between the pair of adjacent laser diode units;
   a second plurality of laser diode units spaced apart from each other along the horizontal direction between the second heat sink and the third heat sink, each laser diode unit of the second plurality of laser diode units comprising a respective laser diode, wherein the laser diodes of the second plurality of laser diode units are electrically connected in series, wherein the first plurality of laser diode units are electrically connected in series to the second plurality of laser diode units;
   at least one first redirecting mirror arranged to receive and redirect light emitted by the first plurality of laser diode units; and
   at least one second redirecting mirror arranged to receive light emitted by the second plurality of laser diode units and the light redirected by the at least one first redirecting mirror.

2. The laser diode assembly of claim 1, further comprising:
   a plurality of electrical contact pads spaced apart from one another along the horizontal direction on a surface of the first heat sink, the first submount of each laser diode unit of the first plurality of laser diode units being positioned on a different respective electrical contact pad of the plurality of electrical contact pads, wherein each vertical conductor of the first plurality of vertical conductors is positioned on a different respective electrical contact pad of the plurality of electrical contact pads.

3. The laser diode assembly of claim 2, wherein, for each laser diode unit of the first plurality of laser diode units, the first submount is in electrical contact with the first-type doped semiconductor layer of the laser diode, and the second submount is in electrical contact with the second-type doped semiconductor layer of the laser diode.

4. The laser diode assembly of claim 3, further comprising:
an electrical contact bar providing a serial electrical connection between a first laser diode of a first laser diode unit and a second laser diode of a second laser diode unit adjacent to the first laser diode unit,
wherein the electrical contact bar provides a direct electrical connection between the second submount of the first laser diode unit and a corresponding electrical contact pad on which the first submount of the second laser diode unit is positioned.

5. The laser diode assembly of claim 3, wherein the plurality of electrical contact pads comprises a plurality of first electrical contact pads on the first heat sink, and
wherein each first submount and each second submount comprises an electrically conductive material.

6. The laser diode assembly of claim 5, further comprises:
a plurality of second electrical contact pads spaced apart from each other on the second heat sink, each second electrical contact pad being in electrical contact with a different corresponding second submount; and
wherein each vertical conductor of the first plurality of vertical conductors provides a direct electrical connection between a corresponding first electrical contact pad and a corresponding second electrical contact pad,
wherein at least one first electrical contact pad provides a direct electrical connection between a corresponding vertical conductor and a corresponding first submount, and at least one second electrical contact pad provides a direct electrical connection between a corresponding vertical conductor and a corresponding second submount, and
wherein laser diodes of adjacent laser diode units are electrically connected in series by a corresponding second electrical contact pad, a corresponding vertical conductor, and a corresponding first electrical contact pad.

7. The laser diode assembly of claim 6 further comprises:
a plurality of third electrical contact pads spaced apart from one another on the third heat sink, each third electrical contact pad being in electrical contact with a different corresponding laser diode unit of the second plurality of laser diode units, each third electrical contact pad providing a serial electrical connection between different pairs of adjacent laser diodes of the second plurality of laser diode units,
wherein a particular third electrical contact pad is in electrical connection with a particular first electrical contact pad, such that the laser diodes of the second plurality of laser diode units are electrically connected in series with the laser diodes of the first plurality of laser diodes units.

8. The laser diode assembly of claim 1, wherein the first heat sink comprises a first edge extending along the horizontal direction, the second heat sink comprises a second edge extending along the horizontal direction, and the third heat sink comprises a third edge extending along the horizontal direction,
wherein each laser diode of the first plurality of laser diode units is configured to emit a first light beam from a first facet of the laser diode, the first facets of the laser diodes of the first plurality of laser diode units being aligned with and adjacent to the first edge and the second edge, and
wherein each laser diode of the second plurality of laser diode units is configured to emit a second light beam from a second facet of the laser diode, the second facets of the laser diodes of the second plurality of laser diode units being aligned with and adjacent to the first edge and the third edge.

9. The laser diode assembly of claim 8, further comprising:
a micro-optical system configured to optically combine the first light beam emitted from each laser diode of the first plurality of laser diode units and the second light beam emitted from each laser diode of the second plurality of laser diode units.

10. The laser diode assembly of claim 9, wherein the micro-optical system comprises:
a first fast-axis collimating (FAC) lens for collimating the first light beam along a fast axis of the first light beam;
a second FAC lens for collimating the second light beam along a fast axis of the second light beam that is parallel to the fast axis of the first light beam;
an optical beam combiner arranged downstream the first FAC lens and configured to transmit the first light beam collimated by the first FAC lens[H]i and
a redirecting mirror arranged downstream the second FAC lens and configured to reflect the second light beam collimated by the second FAC lens to the optical beam combiner, wherein the optical beam combiner is configured to reflect the second light beam from the redirecting mirror towards a direction along the first light beam.

11. The laser diode assembly of claim 10, wherein the optical beam combiner is configured to:
optically multiplex the first light beam and the second light beam by polarization multiplexing or
optically stack the first light beam and the second light beam along the fast axis.

12. The laser diode assembly of claim 1, wherein each laser diode unit of the first plurality of laser diode units comprises a different corresponding laser diode bar having multiple emitters spaced apart from one another along in the horizontal direction, each emitter of the multiple emitters being configured to emit a light sub-beam.

13. The laser diode assembly of claim 12, further comprising a plurality of micro-optical systems arranged downstream from the laser diode bars of the first plurality of laser diode units, each micro-optical system being configured to couple light sub-beams from the multiple emitters of a different corresponding laser diode bar into a corresponding optical fiber.

14. The laser diode assembly of claim 13, wherein each micro-optical system of the plurality of micro-optical systems comprises:
a fast-axis collimating (FAC) lens for collimating the light sub-beams along a fast axis of the light sub-beams from the multiple emitters to produce collimated light sub-beams,
a beam transformation system arranged downstream the FAC lens and configured to shape the collimated light sub-beams to produce shaped light sub-beams; and
a focus lens arranged downstream the beam transformation system and configured to focus the shaped light sub-beams into the corresponding optical fiber.

15. A laser diode assembly comprising:
a heat sink comprising an edge extending along a horizontal direction;
a plurality of electrical contact pads spaced apart from one another along the horizontal direction on the heat sink;

a plurality of submounts spaced apart from one another along the horizontal direction on the heat sink, each submount of the plurality of submounts being positioned on a different corresponding electrical contact pad of the plurality of electrical contact pads;

a plurality of laser diodes, each laser diode comprising a corresponding active layer between a first-type doped semiconductor layer and a second-type doped semiconductor layer and being configured to emit a light beam from a facet of the laser diode, a bottom side of each laser diode being positioned on a different corresponding submount of the plurality of submounts, the facets of the plurality of laser diodes being aligned with and adjacent to the edge of the heat sink, the plurality of laser diodes being electrically connected in series, wherein a corresponding submount and a corresponding laser diode are sequentially positioned on each electrical pad of the plurality of electrical contact pads along a vertical direction perpendicular to the horizontal direction, and wherein the plurality of laser diodes are configured to emit the light beams from the facets of the plurality of laser diodes along a third direction perpendicular to a plane defined by the horizontal direction and the vertical direction, fast axes of the light beams being collinear along the vertical direction, slow axes of the light beams being collinear along the horizontal direction;

for each laser diode of the plurality of laser diodes, a fast-axis collimating (FAC) lens configured to collimate the light beam along the fast axis of the light beam;

for each last diode of the plurality of laser diodes, a reflecting mirror arranged downstream the FAC lens to receive light from the FAC lens; and an optical combiner, wherein each reflecting mirror is configured to reflect light received at the reflecting mirror to the optical combiner, wherein the optical combiner is configured to optically stack light beams received at the optical combiner along the vertical direction.

16. The laser diode assembly of claim 15, further comprising:

at least one electrical contact bar providing a serial electrical connection between first laser diode and second laser diode, wherein the first and second laser diodes are adjacent; and at least one electrical contact wire providing an electrical connection between a top side of the first laser diode to the at least one electrical contact bar, wherein the at least one electrical contact bar is in electrical contact with a corresponding electrical contact pad on which a corresponding submount for the second laser diode is positioned.

17. The laser diode assembly of claim 15, where the plurality of laser diodes forms a plurality of laser diode bars, wherein the laser diode assembly comprises a plurality of beam twisters for the plurality of laser diode bars, each beam twister being configured to rotate light beams in a different corresponding laser diode bar by 90 degrees such that the light beams are optically stacked along the horizontal direction.

* * * * *